(12) United States Patent
Satoh et al.

(10) Patent No.: US 6,573,520 B1
(45) Date of Patent: Jun. 3, 2003

(54) ELECTRON BEAM LITHOGRAPHY SYSTEM

(75) Inventors: Hidetoshi Satoh, Kodaira (JP); Hiroshi Tsuji, Kokubunji (JP); Kunio Harada, Hachioji (JP); Yasunari Sohda, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/534,301

(22) Filed: Mar. 23, 2000

(30) Foreign Application Priority Data

Mar. 26, 1999 (JP) .......................................... 11-083437

(51) Int. Cl.⁷ ................................................. H01L 21/30
(52) U.S. Cl. .................................. 250/492.3; 250/492.2
(58) Field of Search .......................... 250/492.3, 492.2, 250/492.21, 442.11, 440.11, 441.11, 441.1

(56) References Cited

U.S. PATENT DOCUMENTS 5,092,729 A  * 3/1992 Yamazaki et al. .......... 118/505
5,580,419 A  * 12/1996 Berenz
5,914,493 A  * 6/1999 Morita et al. ............ 250/492.2

FOREIGN PATENT DOCUMENTS

JP  402081455  * 3/1990 ............ 250/442.11

* cited by examiner

Primary Examiner—John R. Lee
Assistant Examiner—Anthony Quash
(74) Attorney, Agent, or Firm—Antonelli, Terry, Stout & Kraus, LLP

(57) ABSTRACT

An electron beam lithography system to conduct drawing on a sample with an electron beam within a first chamber. A second chamber is provided which is separated from the first chamber and has a volume smaller than that of the first chamber. A member is provided which is capable of placing the sample on a part separable from an X-Y stage within the first chamber and moving the separable part with the sample thereon to a position for drawing on the sample with the electron beam within the first chamber. A loading arrangement is provided for removing the separable part and the sample from the X-Y stage and moving the separated part to the second chamber from the first chamber. The separable part of the X-Y stage is independently removable from the sample and from the second chamber to outside of the second chamber.

8 Claims, 6 Drawing Sheets

ELECTRON BEAM LITHOGRAPHY SYSTEM

BACKGROUND OF THE INVENTION

1. Field of the Invention

The present invention relates to an electron beam lithography system for drawing circuit patterns to a wafer and a mask by utilizing the electron beam and particularly to an electron beam lithography system which is just suitable for shortening the drawing time and improving the rate of the apparatus operation.

2. Description of the Related Art

In an electron beam lithography system, an X-Y stage for moving a sample is required to draw a pattern on the entire part of the sample such as wafer and mask because the drawing area of the sample on which a pattern is drawn is larger than the deflection range of electron beam. Moreover, since the drawing by the electron beam is conducted under the vacuum condition, the XY stage must be placed within a vacuum chamber which is called a stage-chamber.

In the electron beam lithography system, two or more vacuum chambers are necessary to realize effective pattern drawing, because the stage chamber has a large volume and longer time will be required until the predetermined degree of vacuum required for drawing by electron beam can be attained from the atmospheric condition. Therefore, in an ordinary electron beam lithography system, the stage chambers maintain the low pressure atmosphere and the other chambers change the atmosphere of sample for the vacuum/atmospheric conditions.

Structure of such electron beam lithography system will be explained with reference to FIGS. 10 and 11.

Figure 10:
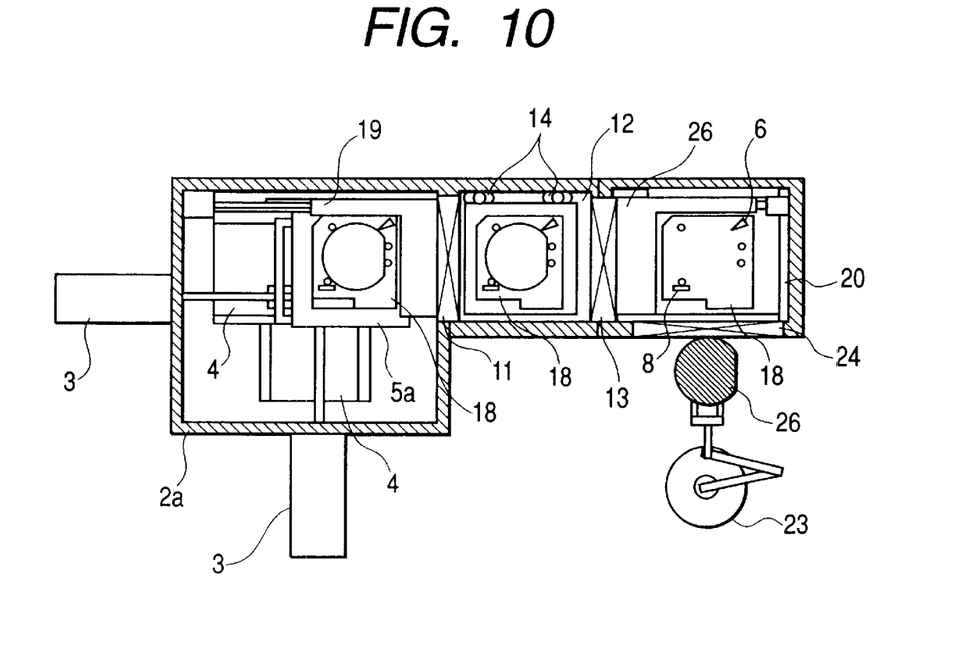
FIG. 10 is an upper cross-sectional view illustrating an example of structure of an electron beam lithography system of the related art.

FIG. 10 is an upper cross-sectional view illustrating an example of structure of an electron beam lithography system of the related art. FIG. 11 is a side cross-sectional view of an electron beam lithography system of FIG. 10.

This example is described in the "Journal of Vacuum Science and Technology B, Vol. 10, No.6, November/December 1992, P.2759" and is composed of three vacuum chambers.

In this technology, a sample exchange chamber 12 and an evacuation chamber 20 are also provided in addition to the stage chambers 2a. In the sample exchange chamber 12 provided adjacently to the stage chamber 2a via a vacuum valve 11, two sheets of sample having completed or not completed the drawing are loaded by a loader mechanism consisting of an elevator 14 or the like while the evacuation atmosphere is maintained for the purpose of cross-exchange. The inside of this sample exchange chamber 12 has the structure to accommodate two sheets of sample and this chamber is moved upward and downward for selection of samples.

Moreover, in the evacuation chamber 20 adjacent to the sample exchange chamber 12 via a vacuum valve 13, the work for evacuating the sample to the predetermined degree of vacuum condition from the atmospheric condition with a vacuum pump 22 or the work for returning the sample which has completed the drawing to the atmospheric condition with a leaking valve 21 are conducted.

With employment of such structure, the time required for the work to increase or evacuate the pressure between the vacuum condition and atmospheric condition and for loading of sample can be shortened and thereby the total number of sheets of samples for the drawing process of the electron beam lithography system can be increased.

Next, sample loading profiles will be explained. When a wafer 26 is used as the sample, following two kinds of techniques are proposed to load the sample to the stage chamber 2a from the evacuation chamber 20. One is a direct wafer loading technique to load independently the wafer 26 placed on a top table 5 of the XY stage from the evacuation chamber 20 and the other is a pallet loading technique to load the wafer 26 together with a pallet 18 to the stage chamber 2a from the evacuation chamber 20 by providing a plate type board called the pallet within the evacuation chamber 20 and then placing the wafer 26 on the pallet 18.

Figure 11:
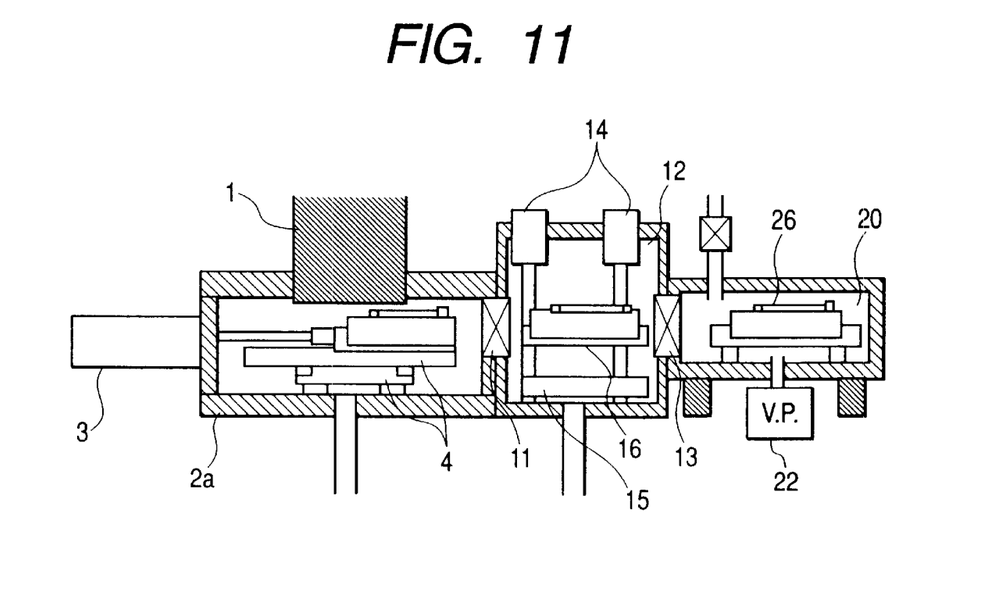
FIG. 11 is a side cross-sectional view of the electron beam lithography system of FIG. 10.

In the examples of FIG. 10 and FIG. 11, the wafer 26 is loaded together with the pallet 18, while the wafer 26 is placed on the pallet 18, between the stage chamber 2a and sample exchange chamber 12 using three pallets 18.

However, the in-vacuum loading technique using such pallet 18 has following problems to be solved.

1) A pallet 18 is heavy and loading velocity is lowered.

Namely, a recent pallet 18 is provided with an electrostatic chuck to attract the wafer 26. Since this electrostatic chuck is formed of ceramics which is mainly composed of alumina or the like, it is heavier in several times or several tens of times the weight of the wafer 26. In addition, since the chuck is also provided with a ground pin 6 and a rotation positioning mechanism 8 of the wafer 26, the weight of the pallet 18 reaches, as a result, about 1 kg to 5 kg. Therefore, it is difficult to realize the loading velocity identical to that for independently loading a wafer 26 and it has been considered as a cause for drop of total throughput of the electron beam lithography system.

2) Compatibility among the pallets 18, namely error of warp of the wafer 26 during the holding thereof will give influence on the drawing accuracy.

In other words, an electrostatic chuck attracts the wafer 26 along the chuck surface, however, if a plurality of sheets of pallet 18 are used, differences in shape of attracting surface of electrostatic chuck among each pallet 18 and in mounting positions of structural elements give influence on reproducibility among wafers 26 of alignment accuracy to lower the accuracy.

The technique to load in direct the wafer 26 is capable of taking an adequate measure to such problem. In this technique, throughput can be improved because the sample loading velocity can be improved.

Moreover, since a plurality of pallets are not used, the wafer attracting surface always becomes constant on the XY stage and warp of the wafer due to the difference in the processing shape of attracting surface of each pallet is eliminated, drawing alignment accuracy can also be improved.

However, the technique to load in direct the wafer 26 also has the following problem.

3) Exchange of ground pin 6 lowers the rate of the apparatus operation.

In other words, if unwanted electric field or magnetic field is generated in the area near the trajectory of electron beam in the electron beam lithography system, the electron beam is bent to result in the fault of drawing pattern. Therefore, the sample must be kept within the equal potential. Therefore, the sample surface is maintained in the equal potential by pricking the sample with a stylus type projection called a ground pin 6.

However, in the course of drawing the patterns on many samples, the end point of the ground pin 6 is worn out not to maintain the equal potential. Therefore, the ground pin 6 must be exchanged periodically. Since this ground pin 6 is set on the XY stage, the stage chamber 2a must be set to the atmospheric condition on the occasion of replacing the ground pin. Accordingly, the rate of the apparatus operation may be lowered.

4) It is difficult to remove particles deposited on the electrostatic chuck.

Namely, the wafer 26 must be fixed on the X-Y stage at the time of drawing a pattern, but there is an example that warp of 50 μm or more is generated on the wafer 26 coming to electron beam lithography process. If the wafer 26 warped as explained above is fixed for the drawing purpose, the alignment accuracy will be lowered. Therefore, an electrostatic chuck utilizing the electrostatic attracting phenomenon is used in order to fix such wafer under the good flatness condition.

However, if particles are adhered on the surface of electrostatic chuck, the wafer 26 is deformed to lower, on the contrary, the accuracy. In this case, therefore, the particles must be removed from the surface of chuck. The stage chamber 2a is also required to be set under the atmospheric condition while the particles are removed. Thereby, the rate of the apparatus operation may also be lowered.

The problem to be solved in the electron beam lithography system to load in direct the samples is that the ground pin can be exchanged and particles on the surface of electrostatic chuck for attracting the wafer can be removed only under the condition that the stage chamber is set to the atmospheric condition.

SUMMARY OF THE INVENTION

It is therefore an object of the present invention to provide an electron beam lithography system which has solved the problems explained above of the related art and can enhance the rate of the apparatus operation and also improve the productivity without lowering the drawing accuracy.

In view of achieving the object explained above, the electron beam lithography system of the present invention forms the stage upper part, consisting of the electrostatic chuck part to be in contact with a sample on the XY stage and a ground pin part, in the structure which may be unloaded from the XY stage body and thereby allows this stage upper part to be moved to the other chamber of small volume partitioned by the vacuum valve from the stage chamber. Thereby, the cleaning of the electrostatic chuck surface and exchange of ground pin can be performed by taking out the stage upper part from the other chamber, namely without setting the stage chamber of large volume for drawing a pattern with the electron beam to the atmospheric condition.

As the other chamber of small volume, an adjustment chamber provided adjacent to the stage chamber or a sample exchange chamber providing a part to place the stage upper part in addition to the place for setting the sample is newly used. These adjustment chamber and sample exchange chamber are provided with a vacuum pump for evacuation and a leaking valve to return chambers to the atmospheric condition in order to realize adjustment of atmosphere for the vacuum and atmospheric conditions.

DETAILED DESCRIPTION OF THE EMBODIMENTS

The preferred embodiment of the present invention will be explained in detail with reference to the accompanying drawings.

Figure 1:
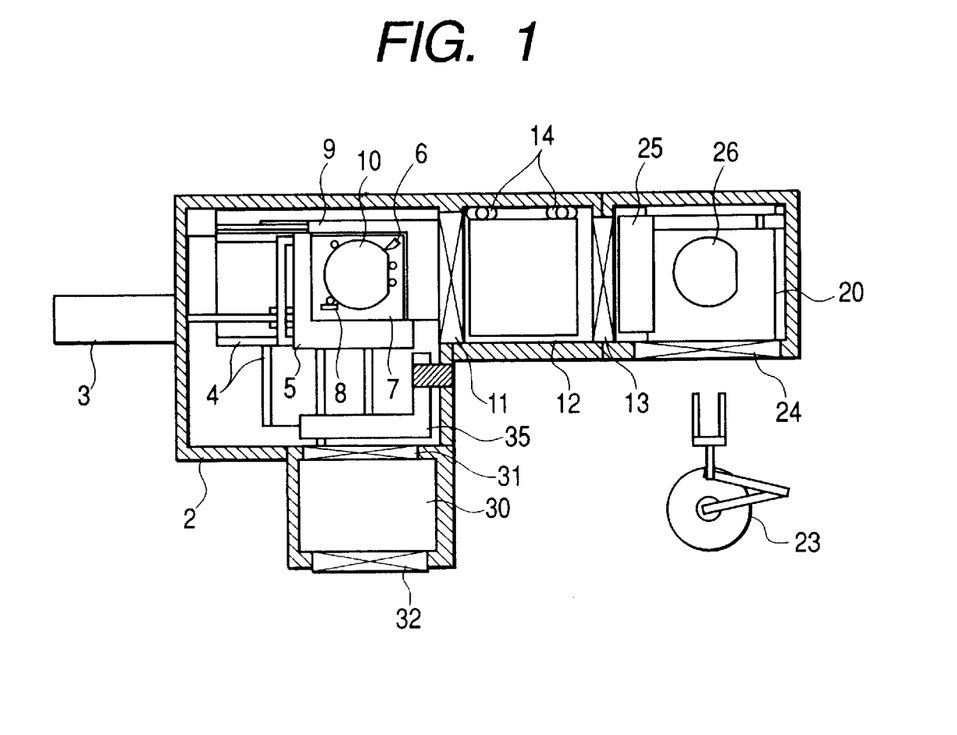
FIG. 1 is an upper cross-sectional view illustrating a first embodiment of a structure in relation to the present invention of an electron beam lithography system.
Figure 2:
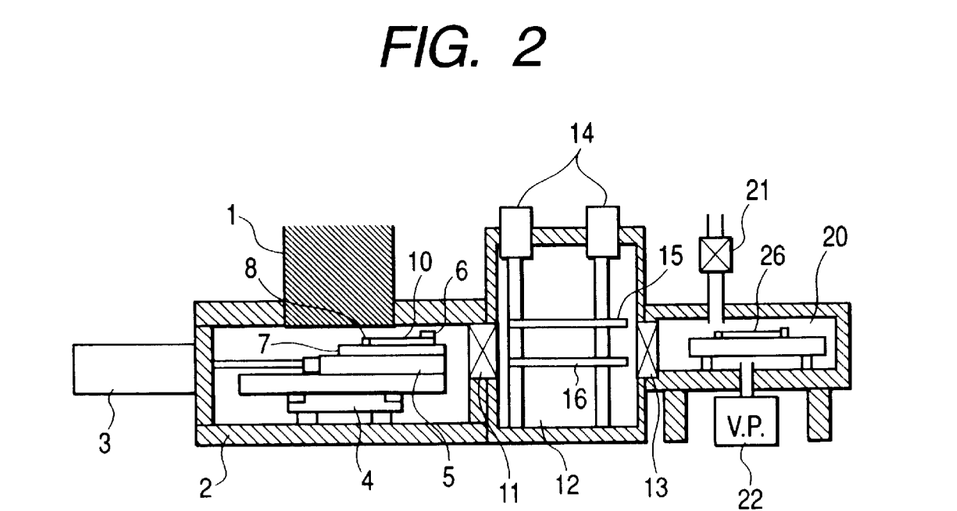
FIG. 2 is a side cross-sectional view of an electron beam lithography system of FIG. 1.

FIG. 1 is an upper cross-sectional view illustrating a first embodiment of structure in relation to the present invention of an electron beam lithography system of the present invention. FIG. 2 is a side cross-sectional view of the electron beam lithography system of FIG. 1.

The electron beam lithography system of this embodiment illustrated in FIG. 1 and FIG. 2 generally comprises an electron beam column 1 which is maintained in the degree of vacuum condition about $10^{-6}$ to $10^{-4}$ Pa and a stage chamber 2. Within the stage chamber 2, a stage drive mechanism 3 for moving a wafer 10, which is a sample of drawing object, in the X-Y direction and an X-Y stage consisting of a stage guide 4 and a top table 5. Therefore, the stage chamber 2 has a large volume.

On the top table 5, the stage upper part consisting of a ground pin 6 for making constant the potential at the surface of the wafer 10, an electrostatic chuck 7 for attracting the wafer 10 with electrostatic force and a wafer rotation adjustment mechanism 8 is provided in such a manner that it can be isolated from the top table 5 through electrostatic attraction.

Moreover, a sample exchange chamber 12 is provided via a vacuum valve 11 at the right side of the stage chamber 2. The sample exchange chamber 12 is usually maintained in the degree of vacuum which is identical to that of the stage chamber 2 and has the wafer floors 15, 16 of upper and lower stages. This wafer floors 15, 16 are moved upward and downward by an elevator 14.

In addition, at the right side of the sample exchange chamber 12, an evacuation chamber 20 of small volume is provided via a vacuum valve 13. This evacuation chamber 20 is connected with a leaking valve 21 and a vacuum pump 22 to change the atmosphere in the chamber between the predetermined degree of vacuum condition and the atmospheric condition. While the atmosphere in the chamber is set to the predetermined degree of vacuum condition, the vacuum valve 13 is opened and wafers 26 are exchanged between the sample exchange chambers 12 with a wafer loading mechanism 25 at evacuation chamber side. Since the evacuation chamber 20 has small volume, internal pressure can be adjusted within a short period of time.

Moreover, the evacuation chamber 20 is provided with a valve 24 at entrance of evacuation chamber and the wafer 26 can be loaded or unloaded using a wafer loading robot 23.

As these three chambers of the stage chamber 2, sample exchange chamber 12 and evacuation chamber 20, the chambers identical to those of the related art may be used.

In this embodiment, a stage adjustment chamber 30 of small volume is provided as a fourth chamber in addition to these three chambers.

This small volume stage adjustment chamber 30 is provided adjacent to the stage chamber 2 via a vacuum valve 31 and is also provided with a leaking valve 33, a vacuum pump 34 and an outer valve 32.

The wafer exchange operation in the electron beam lithography system in the structure explained above will be explained with reference to FIGS. 1, 2 and FIGS. 3, 4.

Figure 3:
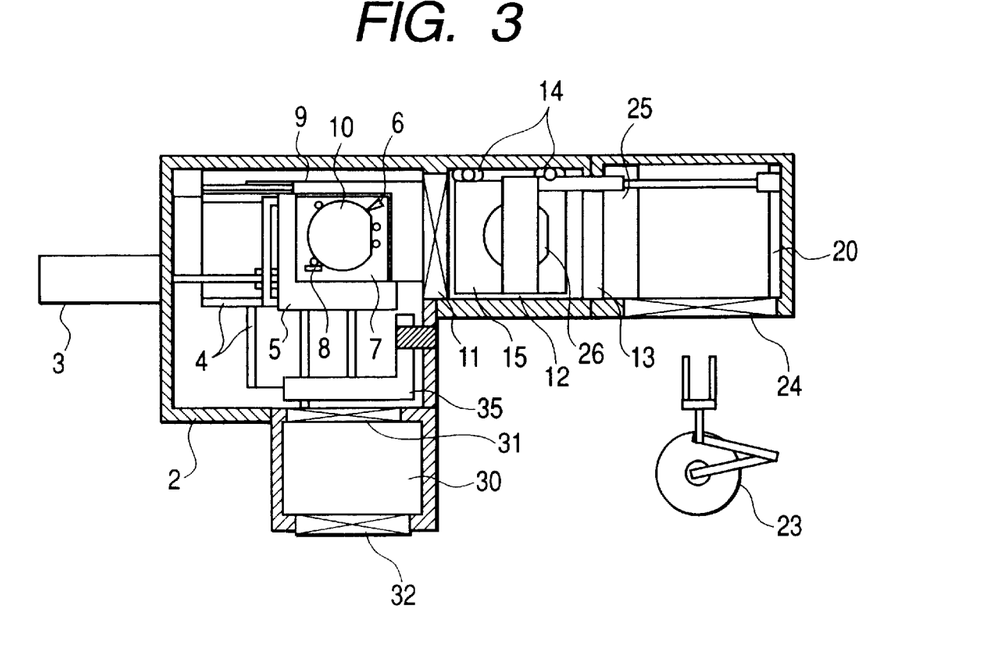
FIG. 3 is an upper cross-sectional view illustrating a first example of structure in relation to the wafer exchange operation of the electron beam lithography system of FIG. 1.
Figure 4:
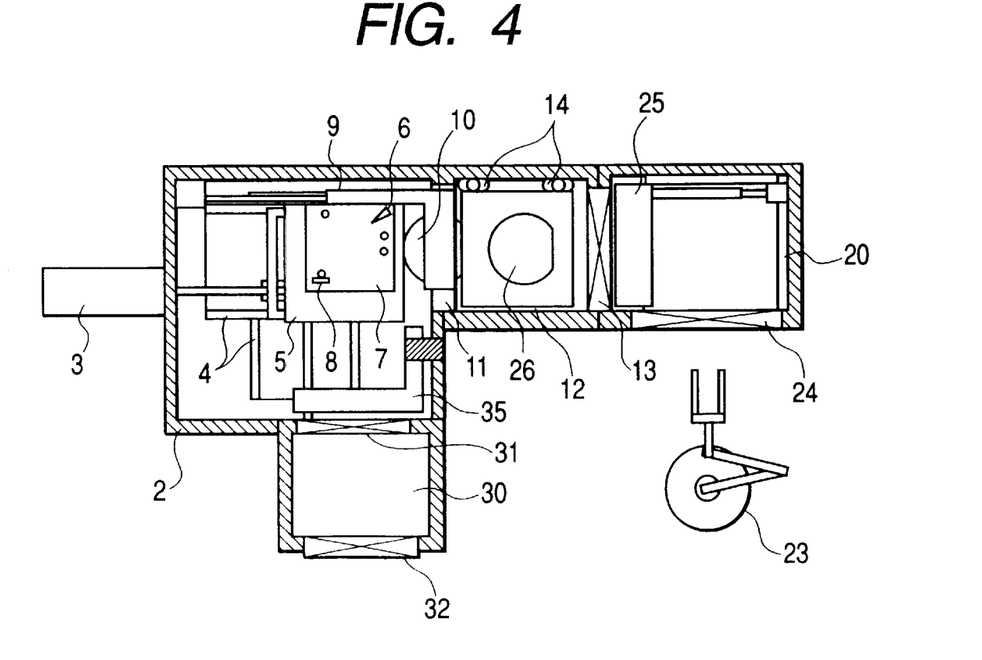
FIG. 4 is an upper cross-sectional view illustrating a second example of structure in relation to the wafer exchange operation of the electron beam lithography system of FIG. 1.

FIG. 3 is an upper cross-sectional view illustrating a first example of structure in relation to the wafer exchange operation of the electron beam lithography system of FIG. 1 and FIG. 4 is an upper cross-sectional view illustrating a second example of structure in relation to the wafer exchange operation of the electron beam lithography system of FIG. 1.

The wafer exchange is performed as explained below in order to realize shortest wafer exchange time.

As illustrated in FIGS. 1 and 2, a sheet of wafer 10 is placed on the top table 5 forming the X-Y stage mechanism in the stage chamber 2. During the drawing on this wafer 10 with the electron beam, the wafer 26 as the next drawing object is loaded by the wafer loading robot 23 into the evacuation chamber 20 in the atmospheric condition. Here, the valve 14 at entrance of evacuation chamber is closed and the inside of evacuation chamber 20 is set to the predetermined vacuum condition using the vacuum pump 22.

Next, as illustrated in FIG. 3, the vacuum valve 13 is opened and the wafer 26 is loaded to the floors 15 at the upper stage of the sample exchange chamber 12. The wafer loading mechanism 25 at evacuation chamber side is returned to the original position, the vacuum valve 13 is closed and the floors 15, 16 are moved upward using the elevator 14 to select the floor 16 of the lower stage as the exchange position.

Even during the operation explained above, drawing on the wafer 10 is continued in the stage chamber 2 until completion of the drawing on the wafer 10 under the condition that the wafer floor 16 in the lower stage is determined as the exchange position.

Upon completion of drawing on the wafer 10, the X-Y stage mechanism is moved along the stage guide 4 by the stage drive mechanism 3 and the top table 5 is returned to the exchange position. Next, the electrostatic chuck 7, ground pin 6 and wafer rotation adjustment mechanism 8 are released from the wafer 10.

As illustrated in FIG. 4, the vacuum valve 11 is opened and the wafer 10 is loaded to the wafer floor 16 of the lower stage of the sample exchange chamber 12 from the stage chamber 2 using the wafer loading mechanism 9 at a stage chamber side.

Thereafter, the wafer loading mechanism 9 at the stage chamber side is returned to the initial position, the wafer floors 15, 16 are moved downward using the elevator 14 in the sample exchange chamber 12 and the wafer floor 15 of the upper stage is determined as the exchange position.

Thereafter, the wafer 26 to which a pattern is not drawn is loaded, in turn, on the top table 5 in the stage chamber 2 from the sample exchange chamber 12 by the wafer loading mechanism 9 at the stage chamber side. After the vacuum valve 11 is closed, the wafer rotation adjustment mechanism 8 is operated to detect the predetermined rotating position, the ground pin 6 is moved downward to be in contact with the wafer 26 to provide the grounding and a voltage is impressed to the electrostatic chuck 7 to attract the wafer 26. Under this condition, drawing of a pattern on the second wafer 26 can be performed.

Moreover, under this condition, the elevator 14 is moved upward again in the sample exchange chamber 12 and the first wafer 10 having completed the drawing located at the wafer floor 16 of the lower stage is moved to the exchange position. Here, the vacuum valve 13 is opened, the wafer 10 is then loaded to the evacuation chamber 20 by the wafer loading mechanism 25 at an evacuation chamber side, the vacuum valve 13 is closed and set to the atmospheric condition through the leaking valve, and thereafter the wafer 10 is taken out by opening the valve 14 at the entrance of the evacuation chamber.

Thereafter, the wafer which does not complete the drawing yet is loaded to the evacuation chamber and similar operation cycle is repeated.

With the operation as explained above, exchange of the wafers 10, 26 is performed only by movement of the wafers between the stage chamber 2 and sample exchange chamber 12. Therefore, exchange can be made in the shortest period and thereby the throughput can be improved. In addition, since only the wafer is loaded unlike the related art technique to load the wafer between the stage chamber and sample exchange chamber using the pallet, weight of the object to be loaded can be reduced to the weight including several kilograms of the pallet and several tens of gram of the wafer. Accordingly, the time required for single exchange of the wafer can be shortened and high speed exchange can also be realized.

In the case where the drawing is performed on 200 wafers a day with the electron beam lithography system by means of the operations explained above, the ground pin 6 is worn out and therefore the pin must be exchanged after about two months. In this case, in the electron beam lithography system of the present embodiment, the stage upper part including the electrostatic chuck 7, ground pin 6, wafer rotation adjustment mechanism 8 is loaded to the small volume stage adjustment chamber 30 from the stage chamber 2 and after the inside of stage adjustment chamber 30 is returned to the atmospheric condition, the upper part of the stage can be removed. As explained above, since the stage upper part is isolated and moved to the small volume stage and thereafter it is removed, the time required for evacuation adjustment can be shortened and the working time required for exchange of ground pin 6 and cleaning of the wafer attracting surface of the electrostatic chuck 7 can also be reduced.

Figure 5:
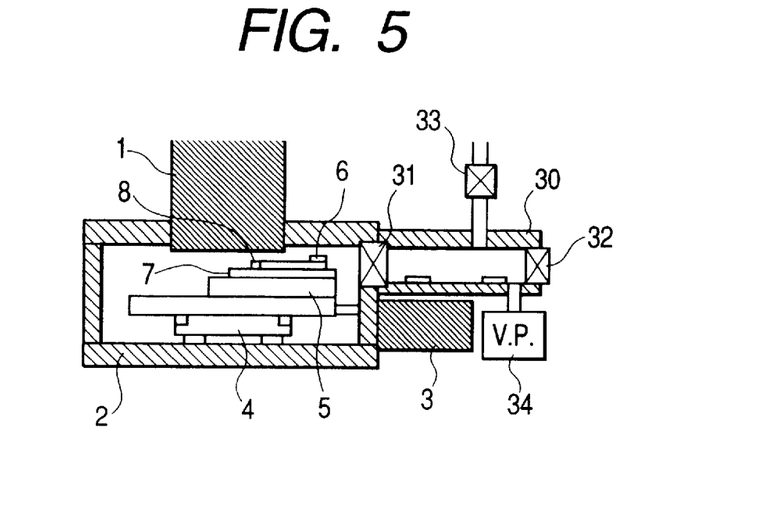
FIG. 5 is a side cross-sectional view illustrating an example of structure in relation to the loading operation of stage upper part of the electron beam lithography system of FIG. 1.
Figure 6:
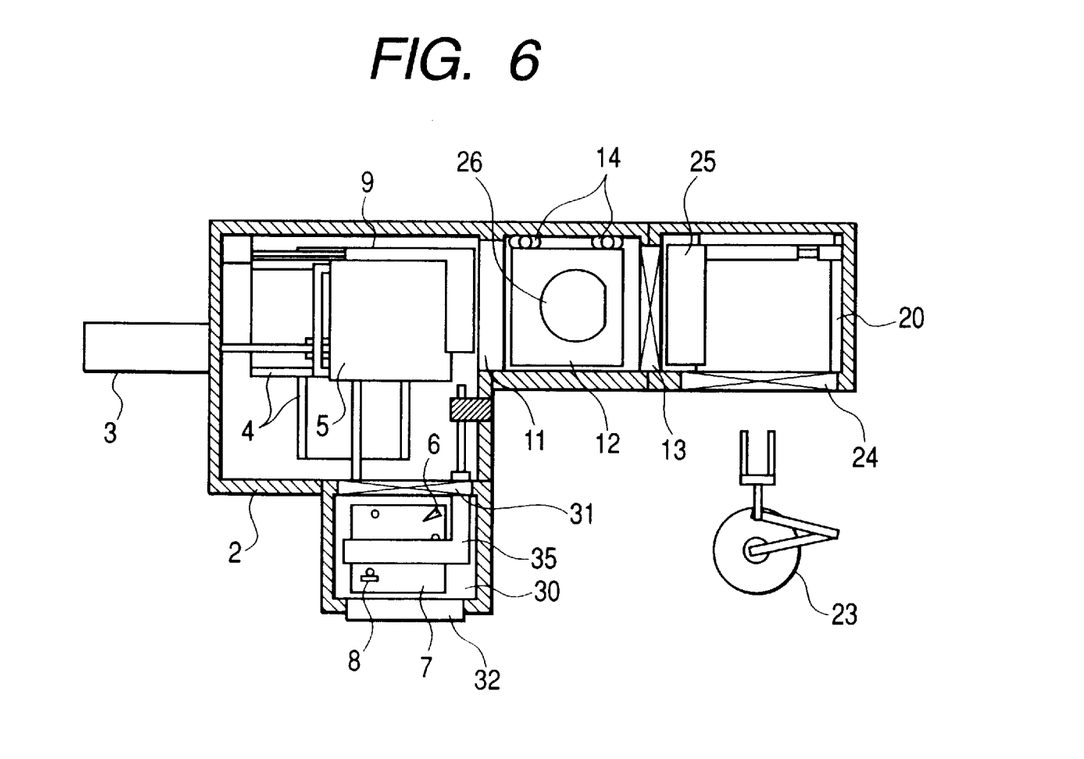
FIG. 6 is an upper cross-sectional view illustrating an example of structure in relation to loading operation of the stage upper part of the electron beam lithography system of FIG. 1.

Such operations will then be explained practically with reference to FIGS. 5 and 6.

FIG. 5 is a side cross-sectional view illustrating an example of structure in relation to the loading operation of the stage upper part of the electron beam lithography system of FIG. 1, while FIG. 6 is an upper cross-sectional view illustrating an example of structure in relation to the loading operation of the stage upper part of the electron beam lithography system of FIG. 1.

First, in FIG. 5, the stage adjustment chamber 30 is set to the identical degree of vacuum as the stage chamber 2 with the vacuum pump 34 and thereafter the vacuum valve 31 is opened.

As illustrated in FIG. 6, the stage upper part including the electrostatic chuck 7, ground pin 6 and wafer rotation adjustment mechanism 8 is isolated from the top table 5 at the X-Y stage body side and is then loaded to the stage adjustment chamber 30 from the stage chamber 2 by a stage upper part loading mechanism 35.

After the loading, a stage upper part loading mechanism 25 is returned to the initial position, the vacuum valve 31 is closed, the leaking valve 33 of FIG. 5 is opened, and the stage adjustment chamber 30 is exposed to the atmospheric condition. Thereafter, the outer valve 32 is in turn opened. With such an operation sequence, the stage upper part can easily be exposed to the atmospheric condition.

After the ground pin 6 is exchanged or the cleaning of the attracting surface of electrostatic chuck is performed, the stage upper part is returned to the stage adjustment chamber 30 and the outer valve 32 is closed to attain the identical degree of vacuum as the stage chamber 2 using the vacuum pump 34. Thereafter, the vacuum valve 31 is opened and the stage upper part is returned on the X-Y stage within the stage chamber 2 using each loading mechanism.

Here, since the stage adjustment chamber 30 is smaller than the stage chamber 2 in the volume, it can be set to the atmospheric or vacuum condition within a short period of time. Accordingly, the time required for suspending the operation of apparatus in order to exchange the ground pin 6 or perform the cleaning of the attracting surface of the electrostatic chuck can be shortened than that of the related art. In other words, in the electron beam lithography system of the related art, when exchange of the ground pin 6 is requested, it is exchanged after radiation of electron beam is stopped and the large volume stage chamber 2 is set to the atmospheric condition and then evacuation of the stage chamber 2 is performed again. Therefore, about 12 hours or longer have been required to complete the necessary works and thereby the rate of the system operation has also been lowered.

As explained above, in this embodiment, the time required for exchange of the ground pin 6 can remarkably be shortened by providing the stage adjustment chamber 30 and stage upper part loading mechanism 35, etc. In addition, if a particles is attracted by the wafer attracting surface of the electrostatic chuck 7 and when drawing is requested on the wafers in different sizes, such request can be solved only by exchanging the stage upper part. Namely, the rate of the system operation can be so far improved in comparison with the electron beam lithography system not including the stage adjustment chamber 30.

Next, another embodiment of the electron beam lithography system of the present invention will be explained with reference to FIG. 7 and FIG. 8.

Figure 7:
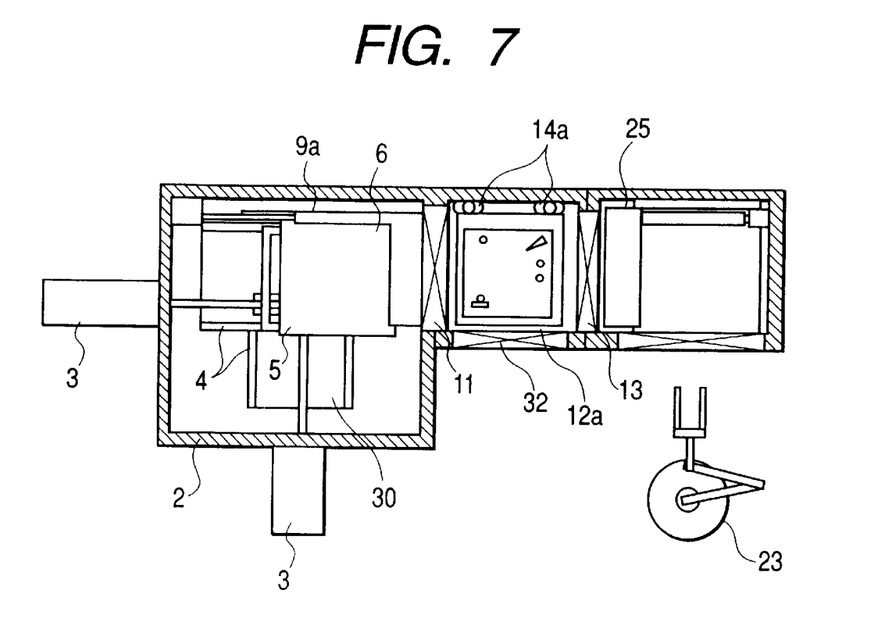
FIG. 7 is an upper cross-sectional view illustrating a second embodiment of the structure in relation to the present invention of the electron beam lithography system of the present invention.
Figure 8:
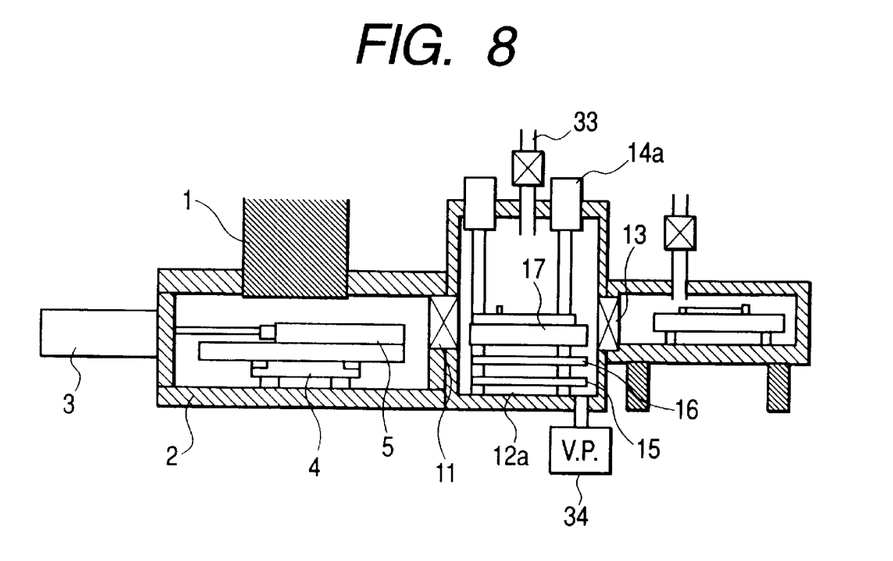
FIG. 8 is a side cross-sectional view of the electron beam lithography system of FIG. 7.

FIG. 7 is an upper sectional view illustrating the second embodiment of structure in relation to the present invention of the electron beam lithography system, while FIG. 8 is a side cross-sectional view of the electron beam lithography system of FIG. 7.

In this embodiment, in view of ruling out the stage adjustment chamber 30 of the electron beam lithography system of FIG. 1, the stage upper part consisting of the electrostatic chuck 7, ground pin 6 and wafer rotation adjustment mechanism 8 or the like is structured to be loaded within a sample exchange chamber 12a.

In other words, the sample exchange chamber 12a is provided with the leaking valve 33 and vacuum pump 34 for evacuation adjustment and moreover a stage upper part floor 17 is also provided in separation from the wafer floors 15, 16 of upper and lower stages. The sample exchange chamber 12a is also maintained usually at the identical degree of vacuum condition to the stage chamber 2a by the vacuum pump 34 in order to perform the wafer exchange work. However, on the occasion of conducting exchange of the ground pin 6 and cleaning of the attracting surface of the electrostatic chuck, the stage upper part is loaded to the stage upper part floor 17 from the stage chamber in the sequence similar to that of the first embodiment explained above. Thereafter, the stage upper part is set again to the atmospheric condition with the leaking valve 33.

In addition, the sample exchange chamber 12a of this embodiment is provided with an outer valve 32 and the stage upper part can be taken out from the sample exchange chamber 12a through the outer valve 32 in order to exchange the ground pin 6 and remove particles at the attracting surface of the electrostatic chuck 7. Since the sample exchange chamber 12a has the volume which is smaller than that of the stage chamber, adjustment of conditions between the evacuation atmosphere condition and atmospheric condition can be made within a short period of time and the suspending time of the system required for exchange of the ground pin 6 and cleaning of the attracting surface of electrostatic chuck can also be reduced.

Figure 9A:
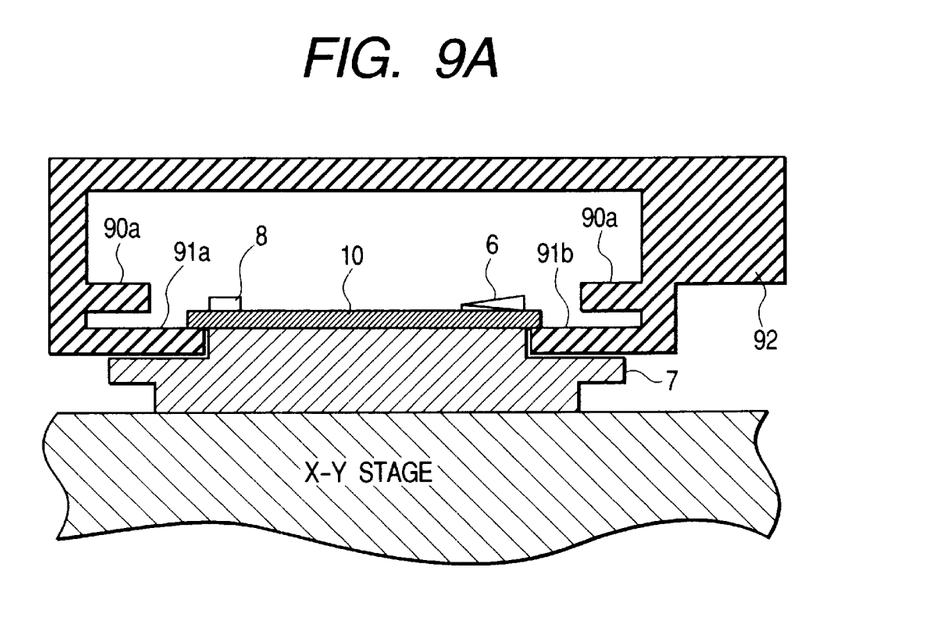
FIGS. 9A and 9B are side cross-sectional views illustrating examples of structure of the wafer loading mechanism at stage-chamber side of FIG. 7.
Figure 9B:
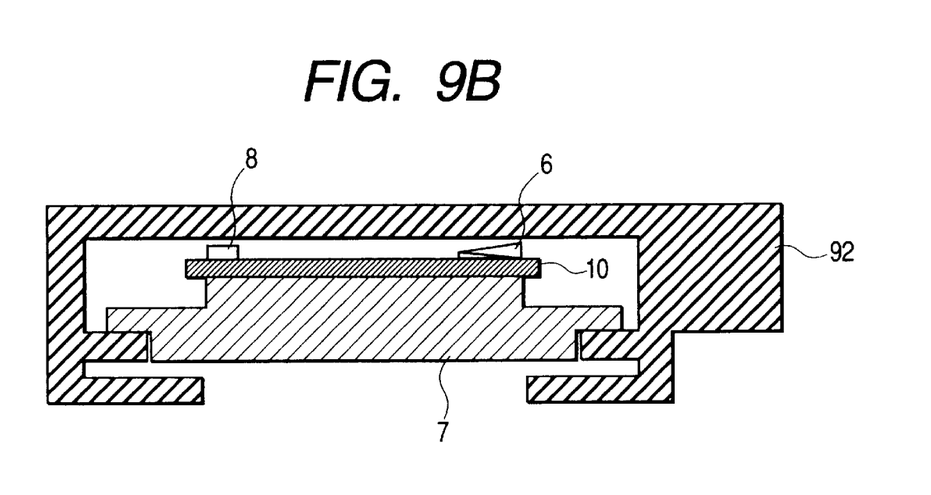

As a wafer loading mechanism 9a at stage chamber side, the other mechanism may be provided in addition to the stage upper part loading mechanism and wafer loading mechanism, but in this embodiment, the structure is introduced so that only one loading mechanism can also be used to load the wafer and stage upper part as illustrated in FIG. 9.

FIGS. 9A and 9B are side cross-sectional views illustrating examples of structure of the wafer loading mechanism at stage chamber side in FIG. 7. The wafer loading mechanism 9a at stage chamber side of examples illustrated in FIG. 9A and FIG. 9B includes an arm 92 arranging the first projections 90a, 90b and second projections 91a, 91b at the upper and lower portions. Both edges of the wafer 10 are place on the first projections 90a, 90b, while both edges of the electrostatic chuck 7 forming the stage upper part for the purpose of loading. When the arm 92 is moved upward and downward, either of the wafer 10 and stage upper part can selectively be moved.

As explained above with reference to FIGS. 1 to 8 and FIGS. 9A and 9B, the electron beam lithography system of the present embodiment introduces the structure so that the part (stage upper part) which is in direct contact with the wafer 10 on the XY stage such as the electrostatic chuck 7, ground pin 6, wafer rotation adjustment mechanism 8 or the like can be isolated (unloaded freely) from the X-Y stage and such stage upper part can be loaded to a small volume chamber such as the newly provided stage adjustment chamber 30 or sample exchange chamber 12a or the like from the stage chamber 2.

Accordingly, the stage upper part can be loaded or unloaded using the chamber which assures higher speed evacuation adjustment than that of the stage chamber 2. As a result, the time, required to suspend the system operation for the works such as exchange of ground pin 6 and removal of particles at the surface of electrostatic chuck 7 which have been done during 12 hours or longer using the stage chamber 2 of the related art, can be reduced and thereby the rate of the system operation can also be improved.

The present invention is not limited only to the embodiments explained above with reference to FIGS. 1 to 8 and FIGS. 9A and 9B and allows desired changes or modification without departing from the scope of the subject matter of the present invention. For example, in the loading mechanisms in FIGS. 9A and 9B, two kinds of projections are provided for loading the wafer 10 illustrated in FIG. 9A and the electrostatic chuck 7 illustrated in FIG. 9B, but it is also possible to introduce the structure in which cutting of the electrostatic chuck 7 is performed in the degree identical to the size of the wafer 10 and thereby first projections 92a, 92b at the upper part of the figure can be eliminated.

Moreover, in this embodiment, the stage upper part consisting of the ground pin 6, electrostatic chuck 7 and wafer rotation adjustment mechanism 8 and the X-Y stage (top table 5) are provided to be isolated (unloaded freely) through the electrostatic attracting function, but it is also possible to introduce the structure that these can be isolated by the other mechanical structure.

As explained previously, according to the present invention, since exchange of ground pin and removal of particles on the surface of electrostatic chuck for attracting the sample can be performed, even in the electron beam lithography system to load in direct the sample, without exposing the stage chamber to the atmospheric condition, namely without lowering the rate of the system operation, productivity can be improved while maintaining high level drawing accuracy.

What is claimed is:

1. An electron beam lithography system to conduct drawing on a sample with an electron beam within a first chamber in an evacuation atmosphere condition, comprising:
    a second chamber which is separated from said first chamber by a vacuum valve to enable exchange of the sample on which the drawing has been completed on the sample as a drawing object;
    a third chamber which is separated from said first chamber by another vacuum valve and has a volume smaller than that of said first chamber and enables adjustment of evacuation;
    an X-Y stage, provided with a stage upper part for placing the sample thereon, for moving the sample placed on said stage upper part to a position for drawing on the sample with said electron beam within said first chamber, said stage upper part having a structure separable from said X-Y stage; and
    a loading means for removing said stage upper part from said X-Y stage and moving said stage upper part to said third chamber in the evacuation atmosphere condition from said first chamber;
    wherein said stage upper part removed from said X-Y stage is removable from said third chamber to outside of said third chamber without setting said first chamber to atmospheric condition, independently of exchanging of the sample as the drawing object on which the drawing has been completed.

2. An electron beam lithography system according to claim 1, wherein said stage upper part includes an electrostatic chuck part and a ground pin part contactable with the sample on said X-Y stage, wherein said electrostatic chuck part is enabled to be cleaned and said ground pin part is enabled to be exchanged upon removal from said third chamber to outside of said third chamber.

3. An electron beam lithography system to conduct drawing on a sample with an electron beam within a stage chamber in an evacuation atmosphere condition, comprising:
    a sample exchange chamber which is separated from said stage chamber by a vacuum valve to enable exchange of the sample on which the drawing has been completed on the sample as a drawing object;
    an evacuation chamber in an adjusted evacuation condition for loading a sample as the drawing object and unloading a sample having completed the drawing;
    an adjustment chamber which is separated from said stage chamber by a vacuum valve and has a volume smaller than that of said stage chamber and enables adjustment of evacuation;
    an X-Y stage, provided with a stage upper part for placing said sample thereon, for moving the sample placed on said stage upper part to a position for drawing on the sample with said electron beam within said stage chamber, said stage upper part having a structure separable from said X-Y stage; and
    a loading means for removing said stage upper part from said X-Y stage and moving said stage upper part to said adjustment chamber in the evacuation atmosphere condition from said stage chamber;
    wherein said stage upper part is removable from said adjustment chamber to outside of said adjustment chamber without setting said stage chamber to atmospheric condition, independently of exchanging of the sample as the drawing object having the drawing completed thereon through the sample exchange chamber.

4. An electron beam lithography system according to claim 3, wherein said stage upper part includes an electrostatic chuck part and a ground pin part contactable with the sample on said X-Y stage, wherein said electrostatic chuck part is enabled to be cleaned and said ground pin part is enabled to be exchanged upon removal from said adjustment chamber to outside of said adjustment chamber.

5. An electron beam lithography system to conduct drawing on a sample with an electron beam within a stage chamber in an evacuation atmosphere condition; comprising:
    an evacuation chamber in an adjusted evacuation condition for loading a sample as a drawing object and unloading a sample having completed the drawing;
    a sample exchange chamber which is separated from said evacuation chamber and said stage chamber vacuum valves for exchanging the sample as the drawing object and the sample having completed the drawing between said evacuation chamber and stage chamber in the evacuation atmosphere condition;
    another chamber which is separated from said stage chamber by a vacuum valve, said another chamber being adjustable in evacuation condition and having a volume smaller than said stage chamber;
    an X-Y stage disposed in said stage chamber and having a separable stage upper part for placing said sample thereon and for moving to a position for drawing on said sample with the electron beam within said stage chamber; and a loading means for separating said separable stage upper part from said X-Y stage and for moving said separable stage upper part to said another chamber in the evacuation atmosphere condition from said stage chamber;

wherein said separable stage upper part of said X-Y stage is removable from said another chamber independently of said sample without setting said stage chamber to atmosphere condition.

6. An electron beam lithography system according to claim 5, wherein said loading means includes an arm in which a first projection to place both edges provided opposed with each other of said sample as the moving object and said projections to place both edges provided opposed with each other of said separable stage upper part as the moving object are arranged in order to select either of said sample or said separable stage upper part through vertical movement on said arm.

7. An electron lithography system for conducting drawing with an electron beam through positioning with an X-Y stage by individually loading samples to a first chamber in an evacuation atmosphere condition through a second chamber, wherein a stage upper part of said X-Y stage which is separable from said X-Y stage and which includes an electrostatic chuck for attracting the sample and a ground pin for maintaining the sample to the equal potential through contact with said sample attracted by said electrostatic chuck is loaded to the X-Y stage in said first chamber and is separately unloaded therefrom through a third chamber without setting said first chamber to atmosphere condition, and thereby said stage upper part can be loaded and unloaded independently of the sample.

8. An electron beam lithography system to conduct drawing on a sample with an electron beam within a first chamber in an evacuation atmosphere condition, comprising:

a second chamber which is separated from said first chamber by a vacuum valve to enable exchange of the sample on which the drawing has been completed on the sample as a drawing object;

a third chamber which is separated from said first chamber by another vacuum valve and has a volume smaller than that of said first chamber and enables adjustment of evacuation;

an X-Y stage disposed in said first chamber and having a separable stage upper part for placing the sample thereon and for moving said separable stage upper part with said sample thereon to a position for drawing on said sample with said electron beam within said first chamber; and a loading means for removing the separable stage upper part from said X-Y stage and for moving said separated stage upper part to said third chamber in the evacuation atmosphere condition from said first chamber;

wherein said separable stage upper part of said X-Y stage is independently removable from the sample through said third chamber to outside of said third chamber without setting said first chamber to atmosphere condition.

* * * * *